(12) United States Patent
Liu et al.

(10) Patent No.: US 8,846,790 B2
(45) Date of Patent: Sep. 30, 2014

(54) RESIN COMPOSITION, AND PREPREG AND PRINTED CIRCUIT BOARD PREPARED USING THE SAME

(75) Inventors: Cheng Ping Liu, Chupei (TW); Tsung Hsien Lin, Chupei (TW); Hsien Te Chen, Chupei (TW); Chih Wei Liao, Chupei (TW)

(73) Assignee: Taiwan Union Technology Corporation, Chupei, Hsinchu County (TW)

( * ) Notice: Subject to any disclaimer, the term of this patent is extended or adjusted under 35 U.S.C. 154(b) by 190 days.

(21) Appl. No.: 13/190,721

(22) Filed: Jul. 26, 2011

(65) Prior Publication Data
US 2012/0279769 A1 Nov. 8, 2012

(30) Foreign Application Priority Data
May 4, 2011 (TW) .............................. 100115574 A (51) Int. Cl.
*H05K 1/00* (2006.01)
*C09D 163/00* (2006.01)

(52) U.S. Cl.
CPC ............... *C09D 163/00* (2013.01); *H05K 1/00* (2013.01)
USPC ........... 524/206; 525/410; 523/400; 523/455; 523/457; 174/258; 428/413

(58) Field of Classification Search
CPC ............................... H05K 1/00; C09D 163/00
USPC ........... 525/410; 524/206; 523/400, 455, 457; 174/258; 428/413
See application file for complete search history.

(56) References Cited

U.S. PATENT DOCUMENTS

| | | | |
|---|---|---|---|
| 4,607,091 A | * | 8/1986 | Schreiber .......................... 528/96 |
| 2005/0196906 A1 | * | 9/2005 | Shi et al. ....................... 438/125 |

FOREIGN PATENT DOCUMENTS

CN 1490318 A 4/2004

OTHER PUBLICATIONS

U.S. Appl. No. 13/006,530, filed Jan. 14, 2011, Shih-Hao Liao.

* cited by examiner

*Primary Examiner* — Kriellion Sanders
(74) *Attorney, Agent, or Firm* — Greer, Burns & Crain, Ltd.

(57) ABSTRACT

A resin composition is provided. The resin composition comprises an epoxy resin, a hardener, and a modifier, wherein the modifier is a polymer solution obtainable from the following steps:
(a) dissolving an N,O-heterocyclic compound of Formula I or Formula II into a first solvent to form a first reaction solution:

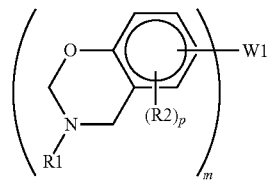

[Formula I]

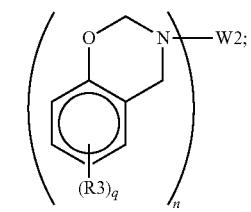

[Formula II]

(b) heating the first reaction solution to a first temperature to carry out a ring-opening polymerization to provide a solution of ring-opening polymerized product; and
(c) cooling the solution of ring-opening polymerized product to a second temperature to substantially terminate the ring-opening polymerization to obtain the polymer solution,
wherein, the first solvent is unreactive to the N,O-heterocyclic compound; the first temperature is higher than the softening temperature of the N,O-heterocyclic compound and lower than the boiling point of the first solvent; and the second temperature is lower than the first temperature.

14 Claims, 2 Drawing Sheets

Comp. Ex. 1     Comp. Ex. 2

RESIN COMPOSITION, AND PREPREG AND PRINTED CIRCUIT BOARD PREPARED USING THE SAME

CROSS REFRENCE

This application claims priority to Taiwan Patent Application No. 100115574 filed on May 4, 2011.

BACKGROUND

1. Field of the Invention

The present invention relates to a resin composition. Specifically, the present invention relates to an epoxy resin composition using a polymer solution prepared from an N,O-heterocyclic compound as a modifier, and the applications of the composition in prepregs and printed circuit boards.

2. Descriptions of the Related Art

Printed circuit boards are circuit substrates that are used for electronic devices to load other electronic components and to electrically connect the components to provide a stable circuit working environment. One kind of conventional printed circuit boards is a copper clad laminate (CCL), which is primarily composed of resin, reinforcing material and copper foil. The resin may be, for example, epoxy resin, novolac resin, polyamine formaldehyde resin, silicone resin or polytetrafluoroethylene resin; and the reinforcing material may be, for example, glass fiber cloth, glass fiber mat, insulating paper or linen cloth.

Generally, a printed circuit broad can be prepared using the following method: immersing a reinforcing material such as a glass fiber fabric into a resin; setting the immersed glass fiber fabric to a half-hardened state, i.e. B-stage, to obtain a prepreg; superimposing a certain number of layers of the prepregs and superimposing a metal foil on at least one external surface of the superimposed prepregs to provide a superimposed object; performing a hot-pressing operation onto the superimposed object, i.e. C-stage, to obtain a metal clad laminate; drilling a plurality of holes on the metal clad laminate and plating these holes with a conductive material to form via holes; and finally, etching the metal foil on the surface of the metal clad laminate to form a defined circuit pattern to accomplish the preparation of the printed circuit broad.

In the preparation of prepregs, the resin composition cannot always completely adhere and cover the surface of the reinforcing material, i.e. voids may remain in the interface between the resin composition and the reinforcing material, due to an insufficient wettability of the resin composition. Moreover, if the adhesion of the prepared prepreg to the metal foil is poor, voids will be easily generated in the interface between the prepreg and the metal foil. Such voids may cause electric leakage of the printed circuit board during operation (especially under a high temperature, a high humidity and a high voltage condition) and thus, result in a short circuit.

The present invention provides a resin composition for preparing printed circuit boards, which possesses a good wettability for the reinforcing material (such as a glass fiber cloth) and thus, can avoid voids being generated between the resin composition and the reinforcing material. In addition, the resin composition of the present invention can also improve the adhesion between the prepreg and the metal foil, i.e., can avoid voids being generated between the prepreg and the metal foil, and thus, can avoid short circuiting that results from the voids.

SUMMARY

An aspect of the present invention is to provide a resin composition, composing:

an epoxy resin;

a hardener; and a modifier, which is a polymer solution obtainable from the following steps:

(a) dissolving an N,O-heterocyclic compound of Formula I or Formula II into a first solvent to form a first reaction solution;

[formula I]

[formula II]

wherein, R1 to R3 are independently selected from the group consisting of H, a halogen, a substituted or unsubstituted C1-C10 alkyl, a substituted or unsubstituted C1-C10 cycloalkyl, and a substituted or unsubstituted C6-C20 aryl;

W1 and W2 are independently selected from the group consisting of H, a halogen, an ether group, a thioether group, a sulfonyl, a sulfonyl, a carbonyl, a substituted or unsubstituted C1-C10 alkyl, a substituted or unsubstituted C1-C10 cycloalkyl and a substituted or unsubstituted C6-C20 aryl;

m and n are independently an integer ranging from 1 to 4;

p is an integer ranging from 1 to 3; and q is an integer ranging from 1 to 4;

(b) heating the first reaction solution to a first temperature to carry out a ring-opening polymerization to provide a solution of ring-opening polymerized product; and (c) cooling the solution of ring-opening polymerized product to a second temperature to substantially terminate the ring-opening polymerization to obtain the polymer solution, wherein, the first solvent is unreactive to the N,O-heterocyclic compound; the first temperature is higher than the softening temperature of the N,O-heterocyclic compound and lower than the boiling point of the first solvent; and the second temperature is lower than the first temperature, and wherein, the amount of the hardener is about 1 part by weight to about 100 parts by weight per 100 parts by weight of the epoxy resin, and based on the solid content (i.e. disregarding the weight of solvent), the amount of the modifier is about 0.5 parts by weight to about 20 parts by weight per 100 parts by weight of the epoxy resin.

Another aspect of the present invention is to provide a prepreg prepared by immersing a substrate into the above resin composition and drying the immersed substrate.

Yet another aspect of the present invention is to provide a printed circuit board prepared by the following steps: superimposing a plurality of the said prepregs and superimposing a metal foil on at least one external surface of the superimposed prepregs to provide a superimposed object; performing a hot-pressing operation to the superimposed object to obtain a metal clad laminate; and patterning the clad metal foil on the metal clad laminate.

To render the above objects, technical features and advantages of the present invention more apparent, the present invention will be described in detail with reference to some embodiments hereinafter.

DETAILED DESCRIPTION

The following will describe some embodiments of the present invention in detail. However, without departing from the spirit of the present invention, the present invention may be embodied in various embodiments and should not be limited to the embodiments described in the specification. In addition, unless it is additionally explained, the expressions "a," "the," or the like recited in the specification (especially in the claims) should include the singular and the plural forms. Furthermore, unless it is additionally explained, while describing the constituents in the solution, mixture and composition in the specification, the amount of each constituent is counted based on the solids content, i.e., disregarding the weight of the solvent.

In addition to the necessary hardener, the resin composition of the present invention further comprises a modifier. The modifier is capable of improving the wettability of the resin composition to the reinforcing material as well as the adhesion between the metal foil and the prepreg prepared by using the resin composition. The modifier is a polymer solution prepared from an N,O-heterocyclic compound.

Specifically, the resin composition of the present invention comprises an epoxy resin, a hardener, and a modifier. The modifier is a polymer solution obtainable from the following steps:

(a) dissolving an N,O-heterocyclic compound into a first solvent to form a first reaction solution;

(b) heating the first reaction solution to a first temperature to carry out a ring-opening polymerization to provide a solution of ring-opening polymerized product; and (c) cooling the solution of ring-opening polymerized product to a second temperature to substantially terminate the ring-opening polymerization to obtain the polymer solution, wherein, the first solvent is unreactive to the N,O-heterocyclic compound; the first temperature is higher than the softening temperature of the N,O-heterocyclic compound and lower than the boiling point of the first solvent; and the second temperature is lower than the first temperature.

In step (a), the N,O-heterocyclic compound has a structure of Formula I or II:

[Formula I]

[Formula II]

wherein, R1 to R3 are independently selected from the group consisting of H, a halogen (e.g., F, Cl, Br etc.), a substituted or unsubstituted C1-C10 alkyl, a substituted or unsubstituted C1-C10 cycloalkyl, and a substituted or unsubstituted C6-C20 aryl; W1 and W2 are independently selected from the group consisting of H, a halogen, an ether group (e.g., $-CH_2OC_2H_5$, $-CH_2OCH_3$, $-C_2H_4OCH_3$, $-O-$ etc.), a thioether group, a sulfonyl group, a sulfinyl, a carbonyl, a substituted or unsubstituted C1-C10 alkyl, a substituted or unsubstituted C1-C10 cycloalkyl and a substituted or unsubstituted C6-C20 aryl; m and n are independently integers ranging from 1 to 4; p is an integer ranging from 1 to 3; and q is an integer ranging from 1 to 4.

In both Formula I and Formula II, in and n are associated with the binding numbers of W1 and W2 respectively. For example, in reference to Formula I, without being restricted by any theory, when m is 1, W1 is a group with a single bond, such as H, —F, —Cl, —Br, —$CH_3$, etc., and the N,O-heterocyclic compound is a compound with one N,O-heterocyclic structure; when m is 2, W1 is a linking group with two bonds and the N,O-heterocyclic compound is a compound with two N,O-heterocyclic structures, and so forth. In some embodiments of the present invention, the illustrated N,O-heterocyclic compounds were provided by means of a chemical synthesis from a phenol compound, an aldehyde compound and an amine compound, as described therein.

In view of the polymerizing difficulty of the N,O-heterocyclic compound and properties of the polymer obtained therefrom, m and n are preferably independently 2 or 3. In this case, W1 and W2 are independently selected from the group consisting of an ether group; a thioether group; a sulfonyl; a sulfinyl; a carbonyl; a C1-C10 alkyl optionally with one or more substituents independently selected from the group consisting of an ether group, a thioether group, a sulfonyl, a sulfinyl and a carbonyl; a C1-C10 cycloalkyl optionally with one or more substituents independently selected from the group consisting of an ether group, a thioether group, a sulfonyl, a sulfinyl and a carbonyl; and a C6-C20 aryl optionally with one or more substituents independently selected from the group consisting of an ether group, a thioether group, a sulfonyl, a sulfinyl and a carbonyl. More preferably, both m and n are 2, and W1 and W2 are independently selected from the group consisting of

In this case, the N,O-heterocyclic compound has a structure of Formula I' or Formula II':

[Formula I']

[Formula II']

In some embodiments of the present invention, is illustrated as the N,O-heterocyclic compound to provide the resin composition of the present invention as modifier. In step (a), the N,O-heterocyclic compound is dissolved into the first solvent to provide the first reaction solution, and the dissolving rate can be increased by heating or stirring. The first solvent may be any inert solvent that can dissolve but not react with the N,O-heterocyclic compound. The boiling point of the first solvent should be at least higher than the maximum operating temperature involved in the preparation of the modifier (i.e. the polymer solution), generally around the temperature for the ring-opening polymerization. The purpose of controlling the boiling point is to avoid the first solvent from escaping during the operation, and thus change the concentration of the first reaction solution, which may result in the difficulty for the subsequent process (e.g., the solution may become too thick to stir) or influence the quality of the prepared polymer solution (e.g., the polymerization degree may be non-uniform).

Without departing from the above conditions, the first solvent, for example, may be a solvent selected from the group consisting of cyclohexanone, toluene, xylene, acetone, butanone, methyl isobutyl ketone, N,N-dimethyl formamide (DMF), N,N-dimethylacetamide (DMAc), N-methyl-pyrrolidone (NMP) and combinations thereof. In some embodiments of the present invention, DMF is illustrated as the first solvent.

The first solvent can be used in any amount as long as it is sufficient for dissolving the N,O-heterocyclic compound used. In view of cost efficiency, the amount of the first solvent is generally about 5 parts by weight to about 60 parts by weight, preferably about 20 parts by weight to about 40 parts by weight per 100 parts by weight of the N,O-heterocyclic compound. In some embodiments of the present invention, the amount of the first solvent is about 25 parts by weight per 100 parts by weight of the N,O-heterocyclic compound.

In step (b), after the N,O-heterocyclic compound is dissolved into the first solvent to form the first reaction solution, energy is supplied to heat the first reaction solution to a first temperature to carry out the ring-opening polymerization. In consideration of the heat transfer uniformity and reaction uniformity, it is preferred to stir the first reaction solution during the temperature-rising period.

The first temperature is at least higher than the softening point of the N,O-heterocyclic compound to carry out the ring-opening polymerization of the N,O-heterocyclic compound without using an expensive, environmentally hazardous catalyst. In addition, the first temperature should be lower than the boiling point of the first solvent to avoid the first solvent from escaping during the operation and then change the concentration of the first reaction solution which may result in difficulty for the subsequent process or influence the quality of the prepared polymer solution. In the following examples, in view of the N,O-heterocyclic compound and solvent used, the first temperature is about 110° C. to about 160° C.

In some embodiments of the present invention, the N,O-heterocyclic compound of Formula I' is used. In this case, without being restricted by any theory, it is contemplated that the ring-opening polymerized product with the structure of Formula III can be obtained after the ring-opening polymerization in step (b).

[Formula III]

wherein, the energy can be supplied to the first reaction solution to raise the temperature of the first temperature through, for example, thermal energy (such as a water bath, oil bath, electrical heater, and heat exchanger), radiant energy (such as UV irradiation and γ-ray irradiation) or combinations thereof.

After the ring-opening polymerization in step (b), a solution of ring-opening polymerized product is provided. Then, in step (c), the solution of ring-opening polymerized product from step (b) is cooled down to a second temperature that is lower than the first temperature by a rapid-cooling manner to substantially terminate the ring-opening polymerization and thus, obtain a stable solution. The term "substantially terminate" means that the polymerization between the N,O-heterocyclic compounds, between the polymers and between the N,O-heterocyclic compounds and the polymers, are considerably ceased. The lower the second temperature, the more remarkable the ceasing effect. On the contrary, the higher the second temperature, the less remarkable the ceasing effect. In addition, the faster the cooling rate of the first reaction solution, the smaller the variation of the gel time of the solution of ring-opened polymerized product during the process of cooling.

The second temperature is generally below the softening point of the N,O-heterocyclic compound, preferably at least 30° C. below the first temperature, and more preferably at least 50° C. below the first temperature.

There is no special limitation on the means for cooling in step (c). For example, the cooling can be achieved by carrying out one of the following operations with or without stirring the solution of ring-opened polymerized product in step (b): adding a second solvent into the solution of ring-opened polymerized product, subjecting the solution of ring-opened polymerized product to a gas atmosphere, subjecting the solution of ring-opened polymerized product to a water bath, and combinations thereof, wherein the temperatures of the second solvent, the gas atmosphere and the water bath should be at least lower than the second temperature.

To achieve the desired rapid-cooling effect, it is preferred to carry out the cooling in step (c) by adding a second solvent (taken alone or in combination with other cooling means). In this manner, the added second solvent not only can come into contact with the solution of the ring-opened polymerized product directly to achieve the rapid-cooling, but can also dilute the concentration of the polymerized product to prevent the polymerized N,O-heterocyclic compound from precipitation due to oversaturation during the process of cooling or storage at low temperature. In some embodiments of the present invention, a rapid-cooling is achieved by adding a second solvent into the solution of the ring-opened polymerized product.

In the case of adding a second solvent into the solution of ring-opened polymerized product to terminate the ring-opening polymerization in step (c), the second solvent may be the same as or different from the first solvent, and may be any solvent which is unreactive with the ring-opening polymerized product. For example, the second solvent may be a polar solvent selected from the group consisting of toluene, xylene, acetone, butanone, methyl isobutyl ketone, cyclohexanone, N,N-dimethyl formamide and combinations thereof. In the following examples, acetone and butanone are illustrated as the second solvent to substantially terminate the ring-opening polymerization. Under the premise of being capable of providing the desired second temperature to substantially terminate the ring-opening polymerization, there is no special limitation on the amount and temperature of the second solvent.

In the resin composition of the present invention, a small amount of the modifier is sufficient to provide the desired improving effect. Generally, based on the solid content, the amount of the modifier is about 0.5 parts by weight to about 20 parts by weight, preferably about 1 part by weight to about 10 parts by weight, per 100 parts by weight of the epoxy resin.

According to the resin composition of the present invention, the epoxy resin contained is a resin with at least two epoxy groups in the molecular structure, such as a novolac epoxy resin, a phosphorus-containing epoxy resin, etc. In some embodiments of the present invention, 9,10-dihydro-9-oxa-10-phosphaphenanthrene-10-oxide (DOPO) and novolac epoxy resin are illustrated as the epoxy resin, in the following examples.

According to the resin composition of the present invention, there is no special limitation on the kinds of the contained hardener. Any conventional hardener which can provide the desired hardening effect can be used. In some embodiments of the present invention, the hardeners are selected from the group consisting of dicyandiamide (Dicy), 4,4'-diaminodiphenyl sulfone (DDS) and phenol Novolac (PN). As to the amount of the hardener, it can be adjusted depending on the users' needs. Generally, the hardener is used in an amount of about 1 part by weight to about 100 parts by weight per 100 parts of weight the epoxy resin, preferably 70 parts by weight to 90 parts by weight per 100 parts by weight of the epoxy resin, but not limited thereto. In addition, without being restricted by any theory, several hardeners can be incorporated into the resin composition of the present invention.

The resin composition of the present invention may optionally further comprise other additives. For example, a hardening promoter selected from the group consisting of 2-methyl-imidazole (2MI), 2-ethyl-4-methyl-imidazole (2E4MI), 2-phenyl-imidazole (2PI) and combinations thereof, but not limited to, may be added to provide an improved hardening effect. The amount of the hardening promoter is generally 0.01 parts by weight to 1 part by weight per 100 parts by weight of the epoxy resin. Also, a filler selected from the group consisting of silica, glass powder, talcum, kaolin, pryan, mica and combinations thereof may be optionally added to the resin composition of present invention to improve the properties of the epoxy resin such as the processability, flammability, thermal resistance and moisture resistance. The amount of filler is generally about 1 part by weight to about 150 parts by weight per 100 parts by weight of the epoxy resin.

In addition to the hardening promoter and filler, the other conventional additives may be optionally added into the resin composition of the present invention, such as a dispersing agent (e.g., a silane coupling agent), a mold-release agent, a flame retardant and a toughening agent.

The resin composition of the present invention may be prepared into varnish form by evenly mixing the epoxy resin, the hardener, the solution of the ring-opened polymerized product as a modifier and other optionally ingredients through a stirrer; and dissolving or dispersing the mixture into a solvent, for subsequent applications.

The present invention further provides a prepreg which is prepared by immersing a substrate (a reinforcing material) into a varnish from the resin composition of the present invention and drying under appropriate drying conditions. A conventional reinforcing material includes a glass fiber cloth (glass fiber fabric, glass fiber paper, glass fiber mat, etc.), a kraft paper, a short fiber cotton paper, a nature fiber cloth, an organic fiber cloth, etc. In some embodiments of the present invention, 7628 glass fiber cloths are illustrated as the reinforcing materials, and the reinforcing materials are heated and dried at 180° C. for 2 to 10 minutes (B-stage) to provide prepregs in a half-hardened state.

Moreover, the present invention also provides a printed circuit board which is prepared by the following process: superimposing a plurality of the said prepregs and superimposing a metal foil (such as copper foil) on at least one external surface of the superimposed prepregs to provide a superimposed object; performing a hot-pressing operation onto the object to provide a metal clad laminate; and patterning the clad metal foil.

The present invention will be further illustrated by the embodiments hereinafter, wherein the measuring instruments and methods are respectively as follows:

[Hygroscopicity Test]

The hygroscopicity of the printed circuit board is tested by the pressure cooker test (PCT), i.e., subjecting the laminate into a pressure container (121° C., 100% R.H. and 2 atm) for 1 hr.

[Solder Floating Test]

The method for testing the solder floating endurance comprises the following: floating a dried printed circuit board in a solder bath at 288° C. for a while and observing whether there is any defect such as delamination and expansion.

[Peeling Strength Test]

The peeling strength refers to the adhesive force of the clad metal foil to the superimposed prepregs. The adhesive force is generally expressed by the force required for vertically peeling the clad copper foil with a width of one inch (25.4 mm) from the surface of the substrate. The passing standard of a substrate with 1 oz copper foil is 4 lb$_f$/in according to MIL-P-55110E.

[Glass Transition Temperature Test]

The glass transition temperature is measured by a dynamic mechanical analyzer (DMA), wherein the measuring regulations are IPC-TM-650.2.4.25C and 24C testing method of Institute for Interconnecting and Packaging Electronic Circuits (IPC).

[Thermal Decomposition Temperature Test]

The thermal decomposition temperature test is carried out by measuring the mass loss of the sample with a thermogravimetric analyzer (TGA). The temperature where the mass loss is up to 5% is regarded as the thermal decomposition temperature.

[Flammability Test]

The flammability test is carried out according to UL94V (Vertical Burn), which comprises burning of a vertically-held printed circuit board, using a Bunsen burner to obtain its self-ignition and combustion-supporting properties. The result is classified from UL94V-0 (the best) to UL94V-2.

[Wettability Test]

An optical microscope is used to observe if there is any cavity such as bubble or void present in the prepreg (observing range: 3 m$^2$).

[Dielectric Constant (Dk) and Dissipation Factor (Df) Measurement]

Dk and Df are measured according to ASTM D150 under an operating frequency of 1 GHz.

EXAMPLES

[The Preparation of the Modifier]

784 g of bisphenol A, 458 g of aniline and 600 g of toluene were charged into a 3 L separable four-necked flask to form a synthetic solution. The four-necked flask was equipped with a heating device, a thermometer, a stirrer, a cooling pipe, a dropper and a decompression recovery device. The synthetic solution was heated to a temperature of about 40° C. and stirred evenly. While stirring, 809 g of 44% formaldehyde in toluene was added dropwise into the synthetic solution in 20 minutes, and at this time, the temperature of the synthetic solution was raised to about 90° C. The synthetic solution was then heated and kept at about 90° C. and reacted for 3 hours. Without being limited by theories, it is believed that the reaction is as follows.

After heating and stirring were discontinued after about 20 minutes, and which the synthetic solution was separated into two layers, the water phase and the trace amount of emulsion in the upper layer were removed. Instantly, the residual solution was again heated to about 90° C. and then the solvent therein was recovered by a decompressing manner (maintaining the pressure to lower than about 90 mmHg). After 30 minutes, the solvent was completely recovered (the temperature was raised to about 130° C.), about 1380 g of N,O-heterocyclic compound A was obtained.

Next, 450 g of N,O-heterocyclic compound A and 115 g cyclohexanone were charged into a 1 L four-necked flask, which was equipped with a heating device, a thermometer, a stirrer, a cooling pipe, a dropper and a decompression recovery device. The resultant mixture was heated to 70° C. and then kept at 70° C. while stirring until N,O-heterocyclic compound A was completely dissolved. Next, the temperature of the resultant mixture was raised to 150° C. to perform the ring-opening polymerization. After reacting for 300 minutes, butanone (185 g, 25° C.) was added to rapidly lower the temperature of the resultant solution to 94° C., and the resultant solution was then cooled to room temperature by natural cooling to terminate the ring-opening polymerization. Modifier A was obtained.

[The Preparation of the Resin Composition]

Example 1

According to the preparations shown in Table 1, 100 parts by weight of novolac epoxy resin (Kolon chemical; KOLON 3165), 3 parts by weight of DICY hardener (Diggesa), 0.12 parts by weight of 2MI, 80 parts by weight of filler (the mixture of talcum and aluminum hydroxide in the ratio of 1:1) and 5 parts by weight of modifier A (based on the solid) were mixed in room temperature with a stirrer for 60 minutes; and then 80 parts by weight of DMF solvent was added. After mixing the resultant mixture in room temperature for 120 minutes, resin composition 1 was obtained.

Example 2

The preparation procedures of Example 1 were repeated to prepare resin composition 2, except that novolac epoxy resin was replaced by 100 parts by weight of DOPO epoxy resin (CCP 330138) and the amount of the hardener promoter was adjusted accordingly, as shown in Table 1.

Example 3

The preparation procedures of Example 2 were repeated to prepare resin composition 3, except that DOPO epoxy resin was replaced by a mixture of 50 parts by weight of DOPO epoxy resin (CCP 330138) and 50 parts by weight of novolac epoxy resin (Kolon chemical; KOLON 3165), as shown in Table 1.

Example 4

The preparation procedures of Example 1 were repeated to prepare resin composition 4, except that the DICY hardener was replaced by 40 parts by weight of DDS hardener (Kingyorker Co.), as shown in Table 1.

Example 5

The preparation procedures of Example 1 were repeated to prepare resin composition 5, except that the DICY hardener was replaced by 40 parts by weight of PN hardener (CCP8110), as shown in Table 1.

Comparative Example 1

The preparation procedures of Example 1 were repeated to prepare comparative resin composition 1 while the modifier A was not used, as shown in Table 1.

Comparative Example 2

The preparation procedures of Example 2 were repeated to prepare comparative resin composition 2 while the modifier A was not used, as shown in Table 1.

[The Preparation of the Prepreg]

The prepregs were prepared by using the resin compositions of Examples 1 to 5 and Comparative Examples 1 and 2, respectively. In detail, the resin composition of one of Examples 1 to 5 and Comparative Examples 1 and 2 was coated on a plurality of 7628 glass fiber cloths (resin/glass fiber cloth: 43%) by a roll coater. The coated 7628 glass fiber cloths were then placed in a dryer and dried at 180° C. for 2 to 10 minutes to prepare prepregs in half-hardened state. Observing whether there is any void in the prepregs prepared by using the resin compositions of Examples 1 to 3 and Comparative Examples 1 and 2. The results are shown in Table 1 and FIGS. 1a and 1b.

Figure 1A:
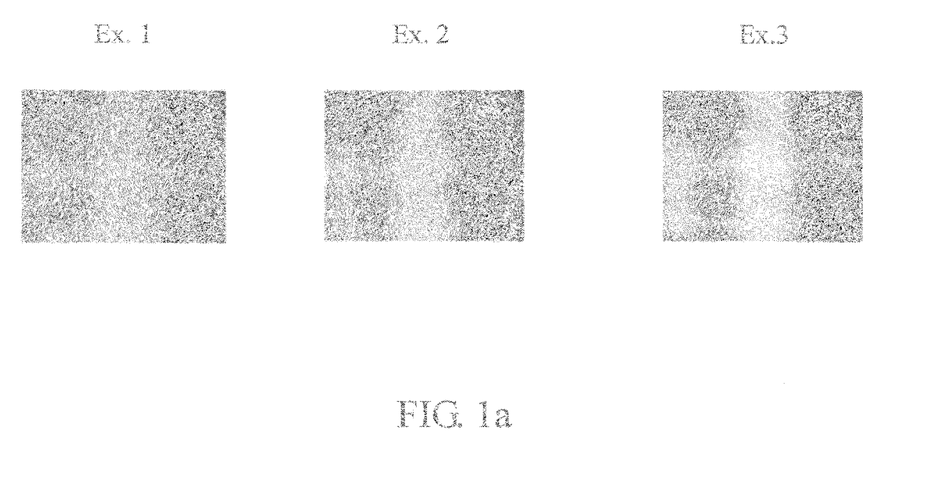
FIG. 1a shows optical microscope images of the prepregs prepared by using the resin compositions of Examples 1 to 3.
Figure 1B:
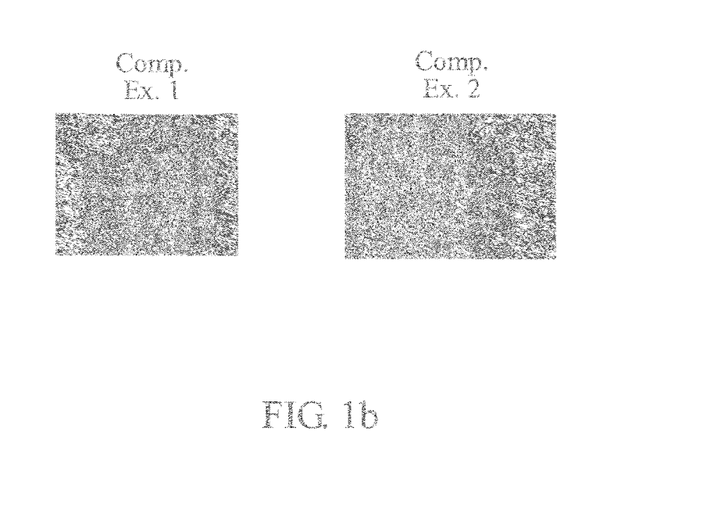
FIG. 1b shows optical microscope images of the prepregs prepared by using the resin compositions of Comparative Examples 1 and 2.

As shown in FIG. 1a, there is no void on the surfaces of the prepregs prepared by using the resin compositions of the present invention, i.e., the surfaces of the glass fiber cloths were almost completely covered by the resin composition. However, as shown in FIG. 1b, the prepregs prepared by using the resin compositions without using the modifier have voids on their surfaces.

[The Preparation of the Printed Circuit Board]

Figure 2:
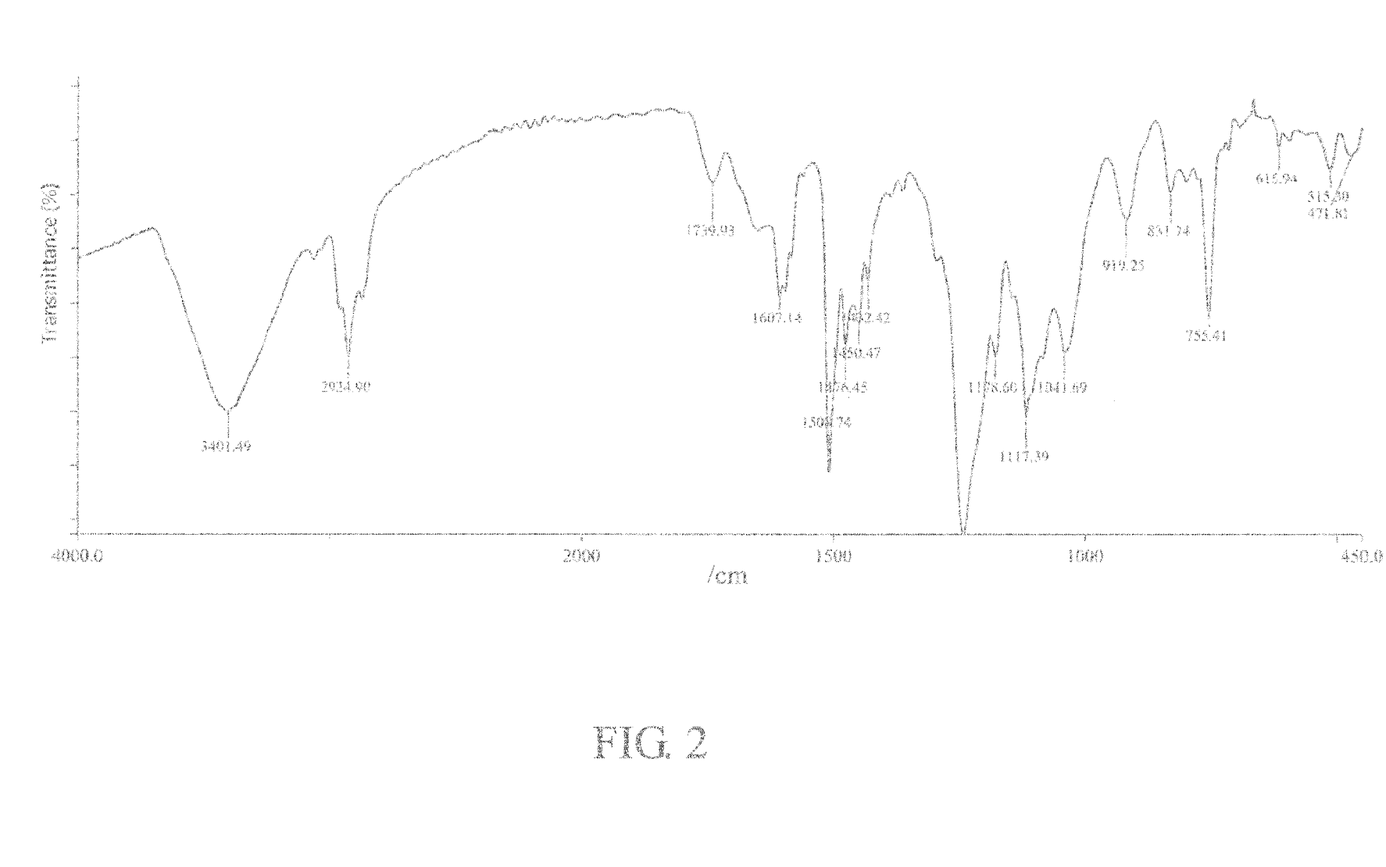
FIG. 2 shows the IR spectrum of the printed circuit board prepared by using the resin composition of Example 1.

The printed circuit boards were prepared by using the prepregs prepared through using the resin compositions of Examples and Comparative Examples, respectively. Eight pieces of the prepregs were superimposed and two copper foils were respectively superimposed on the two external surfaces of the superimposed prepregs to provide a superimposed object. A hot-pressing operation was performed onto the superimposed object to provide a metal clad laminate, wherein the hot-pressing conditions are as follows: raising the temperature to 180° C. with a heating rate of 2.0° C./min, and hot-pressing for 60 minutes under the full pressure of 15 kg/cm$^2$ (the initial pressure is 8 kg/cm$^2$) at 180° C. Finally, the clad copper foils were patterned to form a circuit pattern to obtain the desired printed circuit board. FIG. 2 shows the result of the IR spectrum of the printed circuit board prepared by using resin composition 1 of Example 1. It is observed that there are two characteristic peaks at 1171 cm$^{-1}$ and 831 cm$^{-1}$ due to modifier A.

The hygroscopicity, solder floating, peeling strength, glass transition temperature (Tg), thermal decomposition temperature, flammability, wettability, dielectric constant (Dk) and dissipation factor (Df) of the printed circuit boards were analyzed and the results were shown in Table 1.

TABLE 1

|  | Ex. 1 | Ex. 2 | Ex. 3 | Ex. 4 | Ex. 5 | Comp. Ex. 1 | Comp. Ex. 2 |
| --- | --- | --- | --- | --- | --- | --- | --- |
| novolac epoxy resin | 100 | — | 50 | 100 | 100 | 100 | — |
| DOPO | — | 100 | 50 | — | — | — | 100 |
| Dicy | 3.0 | 3.0 | 3.0 | — | — | 3.0 | 3.0 |
| DDS | — | — | — | 40 | — | — | — |
| PN | — | — | — | — | 40 | — | — |
| modifier A | 5 | 5 | 5 | 5 | 5 | — | — |
| 2MI | 0.12 | 0.14 | 0.14 | 0.12 | 0.12 | 0.12 | 0.14 |
| Filler (talc and aluminum hydroxide in the ratio of 1:1) | 80 | 80 | 80 | 80 | 80 | 80 | 80 |
| DMF | 80 | 80 | 80 | 80 | 80 | 80 | 80 |

The hot-pressing condition: raising the temperature to 180° C. with a raising rate of 2.0° C./min, and hot-pressing for 60 minutes under a full pressure of 15 kg/cm$^2$ (the initial pressure is 8 kg/cm$^2$) under 90° C.

| | Ex. 1 | Ex. 2 | Ex. 3 | Ex. 4 | Ex. 5 | Comp. Ex. 1 | Comp. Ex. 2 |
| --- | --- | --- | --- | --- | --- | --- | --- |
| hygroscopicity (%) | 0.14 | 0.12 | 0.12 | 0.11 | 0.12 | 0.14 | 0..12 |
| solder floating (min) | >10 | >10 | >10 | >10 | 9.5 | >10 | >10 |
| peeling strength (lb$_f$/in) | 8.6 | 8.6 | 8.7 | 8.6 | 8.7 | 8.3 | 8.2 |
| Tg (° C.) | 170 | 163 | 168 | 168 | 167 | 169 | 162 |
| thermal decomposition temperature (° C.) | 360 | 375 | 370 | 369 | 370 | 369 | 378 |

TABLE 1-continued

|  | Ex. 1 | Ex. 2 | Ex. 3 | Ex. 4 | Ex. 5 | Comp. Ex. 1 | Comp. Ex. 2 |
|---|---|---|---|---|---|---|---|
| UL94 level | V-0 | V-0 | V-0 | V-0 | V-0 | V-0 | V-0 |
| Wettability (depending on voids) | c | no | no | no | no | yes | yes |
| Dk (GHz) | 4.40 | 4.43 | 4.34 | 4.41 | 4.38 | 4.52 | 4.40 |
| Df (GHz) | 0.012 | 0.008 | 0.008 | 0.011 | 0.010 | 0.012 | 0.013 |

As shown in Table 1, through the addition of the modifier, not only is the wettability of the resin composition of the invention (Examples 1 to 5) increased, but the adhesion between the prepared prepreg and the copper foil can be increased, too (the peeling strength is at least 8.6 lb/in). In contrast, the conventional resin compositions without using the modifier (Comparative Examples 1 and 2) have poor wettability and thus, are incapable of sufficiently covering the surface of the glass fiber cloth, and the adhesion between the prepared prepreg and the copper foil (the peeling strength is less than 8.6 psi) is poor as well. Consequently, the prepared printed circuit boards tend to meet the problem of electric leakage and thus, results in short circuit.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A resin composition, comprising:
    an epoxy resin;
    a hardener; and
    a modifier, which is a polymer solution obtained from the following steps:
    (a) dissolving an N,O-heterocyclic compound of Formula I or Formula II into a first solvent to form a first reaction solution;

[Formula I]

[Formula II]

wherein,
R1 to R3 are independently selected from the group consisting of H, a halogen, a C1-C10 alkyl, a C1-C10 cycloalkyl, and a C6-C20 aryl;
W1 and W2 are independently selected from the group consisting of H, a halogen, an ether group, a thioether group, a sulfonyl, a sulfinyl, a carbonyl, a C1-C10 alkyl, a C1 -C10 cycloalkyl and a C6-C20 aryl;
m and n are independently an integer ranging from 1 to 4;
p is an integer ranging from 1 to 3; and
q is an integer ranging from 1 to 4;
(b) heating the first reaction solution to a first temperature to carry out a ring-opening polymerization to provide a solution of ring-opening polymerized product; and
(c) cooling the solution of ring-opening polymerized product to a second temperature to substantially terminate the ring-opening polymerization to obtain the polymer solution,
wherein, the first solvent is unreactive to the N,O-heterocyclic compound; the first temperature is higher than the softening temperature of the N,O-heterocyclic compound and lower than the boiling point of the first solvent; and the second temperature is lower than the first temperature, and wherein, the amount of the hardener is about 1 part by weight to about 100 parts by weight per 100 parts by weight of the epoxy resin, and based on the solid, the amount of the modifier is about 0.5 parts by weight to about 20 parts by weight per 100 parts by weight of the epoxy resin.

2. The resin composition of claim 1, wherein m and n are independently 2 or 3, and W1 and W2 are independently selected from the group consisting of an ether group; a thioether group; a sulfonyl; a sulfinyl; a carbonyl; a C1-C10 alkyl optionally with one or more substituents independently selected from the group consisting of an ether group, a thioether group, a sulfonyl, a sulfinyl and a carbonyl; a C1-C10 cycloalkyl optionally with one or more substituents independently selected from the group consisting of an ether group; a thioether group, a sulfonyl and a sulfinyl; and a C6-C20aryl optionally with one or more substituents independently selected from the group consisting of an ether group, a thioether group, a sulfonyl and a sulfinyl.

3. The resin composition of claim 2, wherein m and n are 2, and W1 and W2 are independently selected from the group consisting of and 4. The resin composition of claim 1, wherein the first solvent is selected from the group consisting of cyclohexanone, toluene, xylene, acetone, butanone, methyl isobutyl ketone, N,N-dimethyl formamide (DMF), N,N-dimethylacetamide (DMAc), N-methyl-pyrolidone (NMP) and combinations thereof, and the amount of the first solvent is about 5 parts by weight to about 60 parts by weight per 100 parts by weight of the N,O-heterocyclic compound.

5. The resin composition of claim 1, wherein the step (c) comprises conducting the solution of ring-opening polymerized product to an operation selected from the following group: adding a second solvent into the solution of ring-opening polymerized product, subjecting the solution of ring-opening polymerized product to a gas atmosphere, subjecting the solution of ring-opening polymerized product to a water bath, and combinations of the operations, wherein the temperatures of the second solvent, the gas atmosphere and the water bath are lower than the second temperature, and the second solvent is unreactive to the ring-opening polymerized product.

6. The resin composition of claim 1, wherein the step (c) comprises adding a second solvent into the solution of ring-opening polymerized product to cooling the solution of ring-opening polymerized product to the second temperature, and the second solvent is selected from the group consisting of toluene, xylene, acetone, butanone, methyl isobutyl ketone, cyclohexanone, N,N-dimethyl formamide and combinations thereof.

7. The resin composition of claim 1, wherein the second temperature is at least 30° C. below the first temperature.

8. The resin composition of claim 1, wherein the second temperature is about room temperature.

9. The resin composition of claim 1, wherein based on the solid, the amount of the polymer solution is about 1 part by weight to about 10parts by weight per 100 parts by weight of the epoxy resin.

10. The resin composition of claim 1, wherein hardener is selected form the group consisting of dicyandiamide (Dicy), 4,4'-diaminodiphenyl sulfone (DDS), Phenol Novolac (PN) and combinations thereof.

11. The resin composition of claim 1, which further comprises a hardening promoter selected from the group consisting of 2-methyl-imidazole (2MI), 2-ethyl-4-methyl-imidazole (2E4MI), 2-phenyl-imidazole (2PI) and combinations thereof, wherein the amount of the hardening promoter is about 0.01 parts by weight to about 1 part by weight per 100 parts by weight of the epoxy resin.

12. The resin composition of claim 1, which further comprises a filler selected from the group consisting of silica, glass powder, Talcum, Kaolin, pryan, mica and combinations thereof, wherein the amount of the filler is about 1 part by weight to about 150 parts by weight per 100 parts by weight of the epoxy resin.

13. A prepreg, which is prepared by immersing a substrate Into the resin composition of claim 1 and drying the immersed substrate.

14. A printed circuit board, which is prepared by the following process: superimposing a plurality of the prepreg of claim 13 and superimposing a metal foil on at least one external surface of the superimposed prepregs to provide a superimposed object; performing a hot-pressing operation onto the superimposed object to provide a metal clad laminate; and patterning the clad metal foil.

* * * * *